(12) United States Patent
Yeh et al.

(10) Patent No.: US 6,413,847 B1
(45) Date of Patent: Jul. 2, 2002

(54) METHOD OF FORMING DUMMY METAL PATTERN

(75) Inventors: Tsuei-Chi Yeh; Wei-Yen Chang, both of Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/699,717

(22) Filed: Oct. 30, 2000

(30) Foreign Application Priority Data

Nov. 15, 1999 (TW) ........................................ 088119829

(51) Int. Cl.⁷ .............................................. H01L 21/44
(52) U.S. Cl. ...................... 438/598; 438/598; 438/622; 438/618; 438/669; 438/675
(58) Field of Search ................. 438/598, 622, 438/624, 631, 634, 618, 675, 669, 637

(56) References Cited

U.S. PATENT DOCUMENTS 5,798,298 A * 8/1998 Yang et al. ................. 438/622
5,959,320 A * 9/1999 Torgerson et al. .......... 257/296
6,022,804 A * 2/2000 Yano et al. ................. 438/675
6,133,144 A * 10/2000 Tsai et al. ................... 438/634
6,218,282 B1 * 4/2001 Buynoski .................... 438/619
6,243,653 B1 * 6/2001 Findley ........................ 702/65

FOREIGN PATENT DOCUMENTS

| JP | 406069214 A | * | 3/1994 |
| JP | 408306771 A | * | 11/1996 |
| JP | 10294366 A | * | 4/1997 |

* cited by examiner

Primary Examiner—Carl Whitehead, Jr.
Assistant Examiner—Khanh Duong
(74) Attorney, Agent, or Firm—J.C. Patents

(57) ABSTRACT

A method of forming a dummy metal pattern for manufacturing an interconnect pattern. The invention forms a dummy metal pattern on a wafer having a fixed layout while fabricating an interconnect so as to make uniform the metal line pattern on the wafer. Thus, a loading effect can be avoided to benefit a subsequent process, device reliability can be enhanced, and yield can also be increased.

12 Claims, 6 Drawing Sheets

METHOD OF FORMING DUMMY METAL PATTERN

CROSS-REFERENCE TO RELATED APPLICATION

This application claims the priority benefit of Taiwan application Ser. No. 88119829, filed Nov. 15, 1999.

BACKGROUND OF THE INVENTION

1. Field of Invention

The present invention relates to a method of forming a semiconductor device. More particularly, the present invention relates to a method of forming a dummy metal pattern for a process of forming a metal interconnect.

2. Description of Related Art

In accordance with the increasing integration in integrated circuits, more than two layers of interconnects has gradually become the standard in many integrated circuit fabrications. In general, a dry etching method is suitable for fabrication of high density semiconductor devices. Accordingly, dry etching becomes the increasingly important for the fabrication of high density semiconductor devices. Dry etching is commonly used to etch a metal layer to form a required metal interconnect pattern.

In order to define a circuity pattern on a silicon wafer, photolithography is performed to transfer the circuit layout pattern to the silicon wafer. The wafer is then transferred into a chamber or a tank to etch out an unnecessary layer of dielectric (or conductive) material which has no photoresist protection above.

FIG. 1A is a schematic, cross-sectional view showing a metal pattern on a conventional semiconductor substrate. Every metal layer has different spaces between patterns depending on the location of the patterns. As shown in FIG. 1A, a wafer 100 includes a region 102 with a dense metal pattern and a region 104 with a sparse metal pattern.

As can be seen from FIG. 1A, the metal pattern densities in the above-mentioned regions 102 and 104 are quite different due to the different spaces. If the metal pattern density of the region 104 with a sparse metal pattern is less than a specific density, a dielectric layer which is subsequently formed on the wafer 100 forms a dish-shaped surface. In other words, in cases where the density difference between the regions 102 and 104 is too large, when a dielectric layer is formed on the wafer 100, the dielectric layer forms a dish-shaped surface. This leads to a different etching rate in the region 102 with a dense metal pattern and in the region 104 with a sparse metal pattern. This is known as a loading effect, and is illustrated in FIG. 1B.

A dry etching process is a chemical or a chemical/mechanical mixed process, and its reaction rate is related to how dense the material that has to be etched out is. When a metal interconnect is fabricated in a conventional method, the pattern density of metal layers is not uniform and leads to quite different etching rates in the region with dense metal density and in the region with sparse metal density. Thus, disparities in pattern density cause difficulties in etching.

Moreover, another factor that affects an etching process is the thickness of a subsequently formed dielectric material layer (106 in FIG. 1B). Since the pattern density of metal layers is not uniform, the dielectric layer forms a dish-like surface having an obviously varying surface height. Thus, the etch stop point is difficult to be detected when etching the dielectric layer, which leads to over or under-etching. Both over and under-etching are not desirable in the integrated circuit manufacturing process.

SUMMARY OF THE INVENTION

Accordingly, the invention provides a method of forming a dummy metal pattern, which can avoid a loading effect while fabricating a metal interconnect.

Another purpose of the invention is to provide a method of forming a dummy metal pattern. The method can enhance reliability of devices and increase yield.

The invention provides a method of forming a dummy metal pattern for a process of forming a metal interconnect. At first, a substrate is provided. The substrate comprises a first region with a dense metal pattern and a second region with a sparse metal pattern. The first region has a higher metal pattern density than that of the second region. Then a metal pattern density of the second region is evaluated. If the metal pattern density of the second region is less than a specific density, then a dummy metal pattern is provided in the second region to make uniform the metal pattern density of the substrate.

The specific density depends on surface shape of a subsequently formed dielectric layer on the substrate. If the metal pattern density of the second region is less than the specific density, the dielectric layer forms a dish-shaped surface. If the metal pattern density of the second region is larger than the specific density, the dielectric layer does not form a dish-shaped surface.

Moreover, the invention provides a method of forming a dummy metal pattern for manufacturing an interconnect pattern. At first, a first dielectric layer is formed on a substrate. A first metal layer is formed on the first dielectric layer. The first metal layer is defined to form a plurality of first metal lines with a first direction wherein the first metal lines are uniform on the substrate. Unnecessary connection between the first metal lines is broken according to the required interconnect pattern. The broken first metal lines remain to form a connected first metal pattern and a first dummy metal pattern so that the substrate has a uniform pattern density. A second dielectric layer is formed on the metal lines and the first dielectric layer. The second dielectric layer is defined, until the first metal lines are exposed, to form a plurality of via holes. A plurality of plugs are formed in the via holes, such that the plugs and the second dielectric layer have the same surface level. A second metal layer is formed on the second dielectric layer and the plugs. The second metal layer is defined to form a plurality of second metal lines with a second direction wherein the second metal lines have a uniform pattern density. Unnecessary connection between the second metal lines is broken according to the interconnect pattern. The broken second metal lines remain to form a connected second metal pattern and a second dummy metal pattern so that the substrate has a uniform pattern density. The connected second metal pattern is electrically connected to the first metal pattern.

Additionally, the invention provides a method for designing a photomask for patterning an interconnect pattern. A metal pattern with uniform pattern density is designed. The metal pattern comprises a first metal pattern with a first direction and uniform pattern density, and a second metal pattern with a second direction and uniform pattern density. The first direction is perpendicular to the second direction. Unnecessary connection between the first metal lines and between the second metal lines is broken according to the interconnect pattern. The broken first metal lines and the broken second metal lines remain to form a connected metal pattern and a dummy metal pattern.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3A to 3G are schematic, cross-sectional views illustrating a method of forming a dummy metal pattern for a process of forming a metal interconnect according to a second preferred embodiment of this invention, in which FIGS. 3F to 3G are schematic, top views, and FIG. 3E is a schematic, cross-sectional view taken along a cutting line I—I in FIG. 3F.

DESCRIPTION OF THE PREFERRED EMBODIMENTS

First Embodiment

Figure 1A:
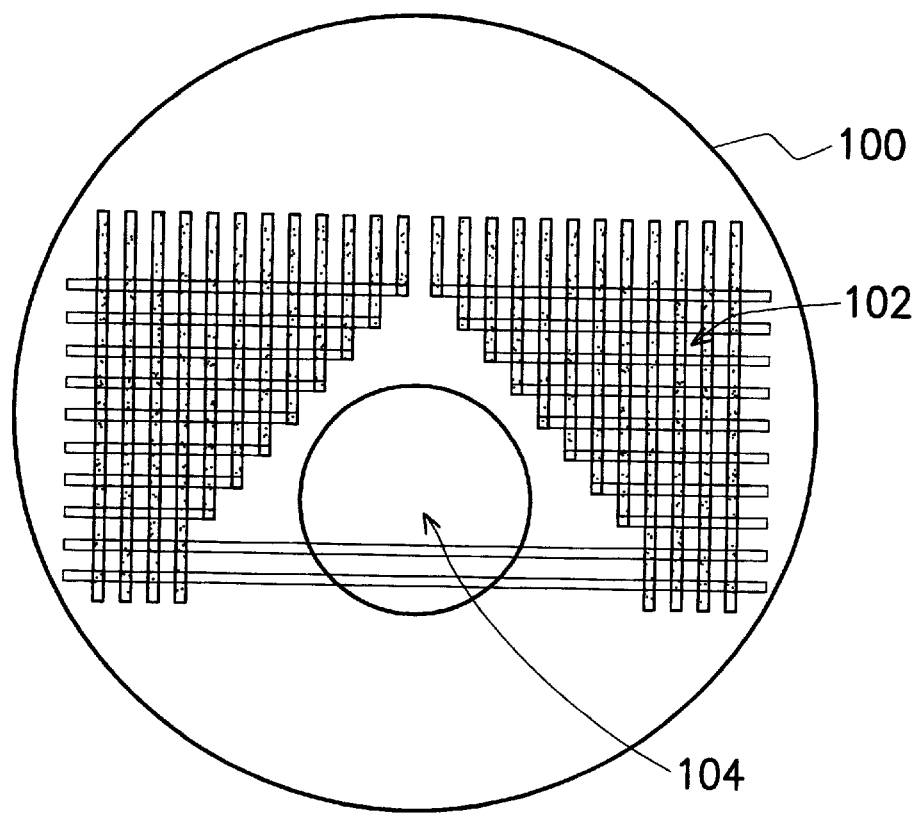
FIG. 1A is a schematic, cross-sectional view showing a metal pattern on a conventional semiconductor substrate.
Figure 1B:
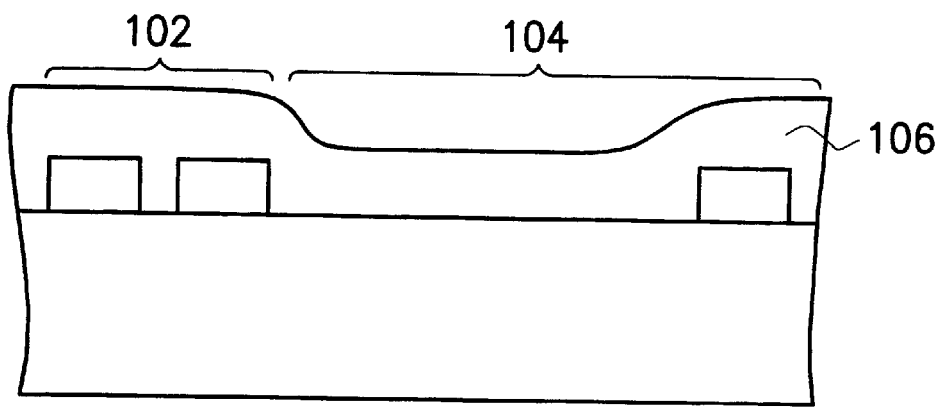
FIG. 1B shows a conventional semiconductor substrate after a dielectric layer is formed.
Figure 2A:
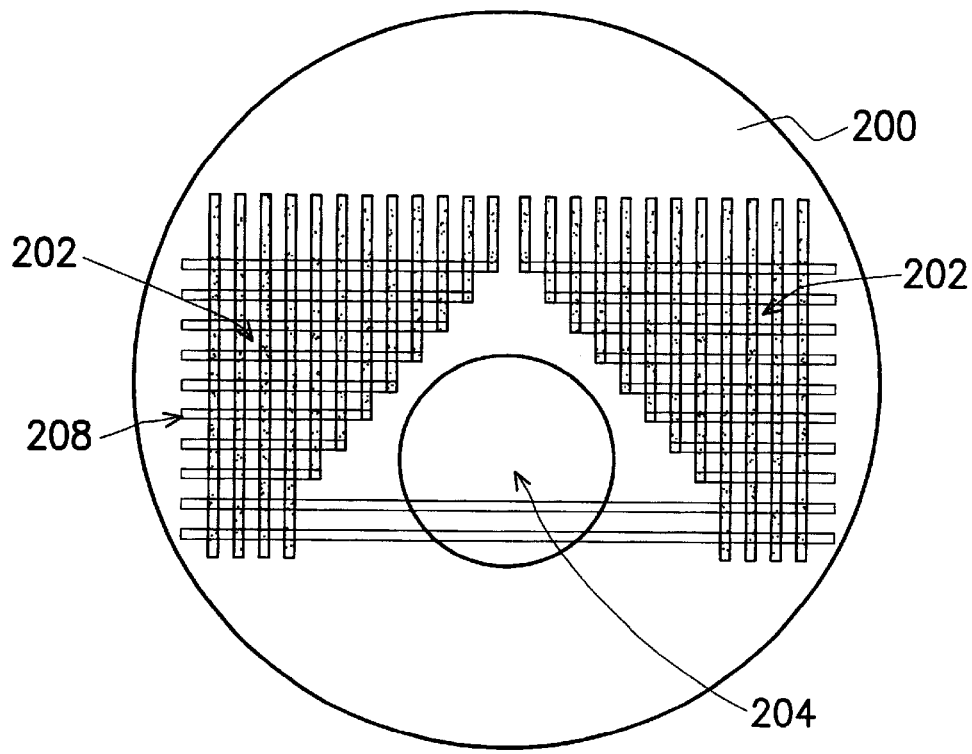
FIGS. 2A to 2B are schematic, cross-sectional views illustrating a method of forming a dummy metal pattern for a process of forming a metal interconnect according to a first preferred embodiment of this invention.
Figure 2B:
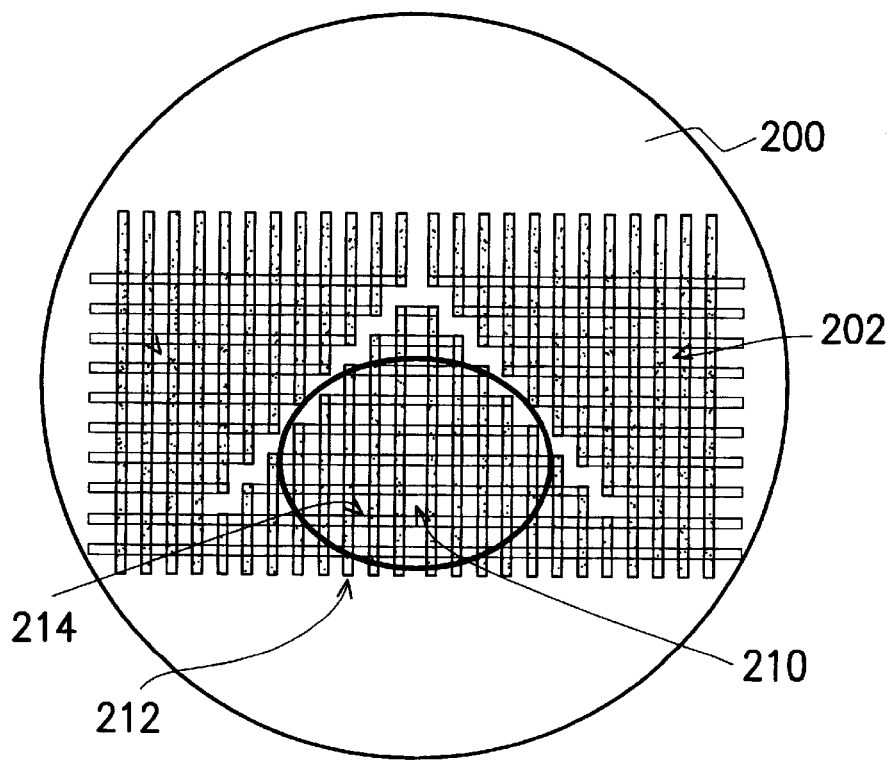

FIGS. 2A to 2B are schematic, cross-sectional views illustrating a method of forming a dummy metal pattern for a process of forming a metal interconnect according to a first preferred embodiment of this invention, in which FIGS. 2A to 2B are top views.

Referring to FIG. 2A, a semiconductor substrate 200 is provided. The substrate 200 comprises a first region 202 with a dense metal pattern and a second region 204 with a sparse metal pattern. The first region 202 has higher metal pattern density than that of the second region 204. The metal pattern of the first region 202 includes, for example, a first under-layer metal pattern 206 with a first direction and uniform pattern density, and a second metal pattern 208 with a second direction and uniform pattern density. The first direction is perpendicular to the second direction. In addition, the metal pattern of the first region 202 and the second region 204 can be other pattern.

Then, the metal pattern density of the second region 204 with sparse pattern is evaluated. If the metal pattern density of the second region 204 is less than a specific density, a dummy metal pattern 210 is provided in the second region 204 with sparse pattern to uniform metal pattern density of the substrate 200, as shown in FIG. 2B.

The specific density depends on surface shape of a subsequently formed dielectric layer on the substrate. If the metal pattern density of the second region 204 is less than the specific density, the dielectric layer forms a dish-shaped surface. If the metal pattern density of the second region 204 is larger than the specific density, the dielectric layer does not form a dish-shaped surface. The specific density is known by persons skilled in the art.

The pattern of the dummy metal pattern 210 includes, for example, a third under-layer metal pattern 212 with a first direction and uniform pattern density, and a forth metal pattern 214 with a second direction and uniform pattern density. The first direction is perpendicular to the second direction. In addition, the metal pattern of the dummy metal pattern 210 and the second region 204 can be other pattern.

The dummy metal pattern 210 can be floating, or connected to a ground or a power source. When the dummy metal pattern 210 is connected to a ground or a power source, parasitic capacitance may be increased. But, the invention can effectively reduce noise and increase transmission speed.

The above-mentioned metal pattern including the original metal pattern on the substrate 200 and the dummy metal pattern 210 can be made of aluminum, copper, aluminum-copper alloy, or other metal.

In the first embodiment, the invention is to provide a dummy metal pattern in a region with sparse metal pattern to uniform the pattern density on a wafer while fabricating a metal interconnect. Thus, while a dielectric layer is subsequently formed on the wafer, the dielectric layer does not form a dish-shaped surface in the region with sparse pattern, and it is easier to detect an etching end point while etching. Therefore, load effect can be avoided. Reliability can be enhanced and yield can be increased. Second embodiment FIGS. 3A to 3G are schematic, cross-sectional views illustrating a method of forming a dummy metal pattern for a process of forming a metal interconnect according to a second preferred embodiment of this invention. FIGS. 3F to 3G are schematic, top views, in which FIG. 3E is a cross-sectional view taken along a cutting line 1—1 in FIG. 3F.

Figure 3A:
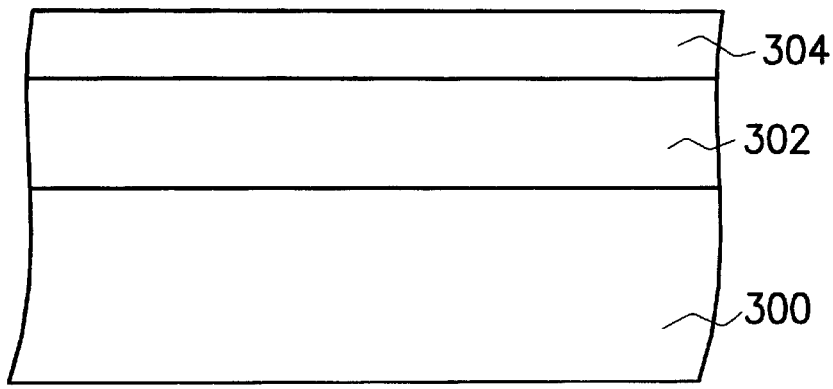

Referring to FIG. 3A, a semiconductor substrate 300 is provided. A dielectric layer 302 and a metal layer 304 are sequentially formed on the substrate 300. The metal layer 304 includes, aluminum, copper, aluminum copper alloy, or other similar material.

Figure 3B:
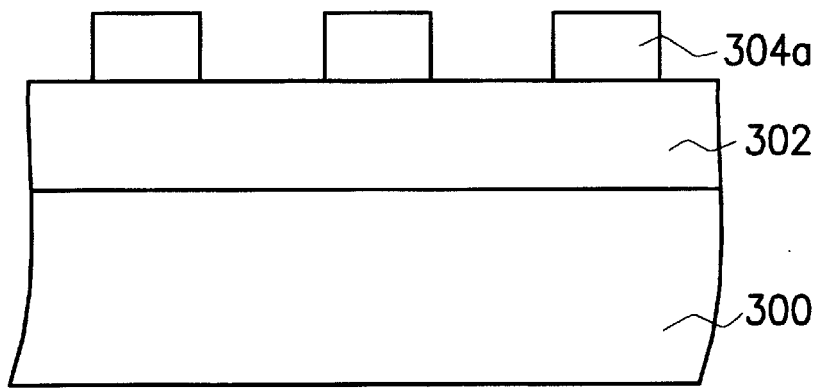

Referring to FIG. 3B, the metal layer 304 is defined by photolithography and etching to form a plurality of metal lines 304a with a first direction. The metal lines 304a are uniform on the substrate 300.

According to the required interconnect pattern, unnecessary connection between the metal lines 304a is broken, and the broken metal lines 304a remain to form a connected metal pattern and a dummy metal pattern so that the substrate 300 has a uniform pattern density. In this step, in order to clearly describe the invention, referring to the top view of FIG. 3G. In FIG. 3G, dash lines between the metal lines 304a are the broken portions of the metal lines 304a; that is, the unnecessary connection portion of the metal lines 304a. Herein the breaking method includes dry etching, for example.

The dummy metal pattern can be floating, or connected to a ground or a power source. When the dummy metal pattern is connected to a ground or a power source, parasitic capacitance may be increased. But, the invention can effectively reduce noise and increase transmission speed.

Figure 3C:
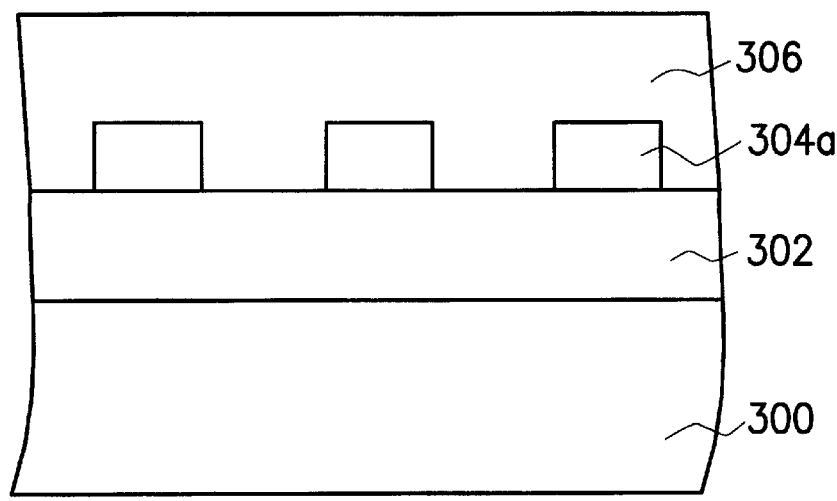

Referring to FIG. 3C, another dielectric layer 306 is formed on the metal line 304a and the dielectric layer 302 to cover the metal lines 304a.

Figure 3D:
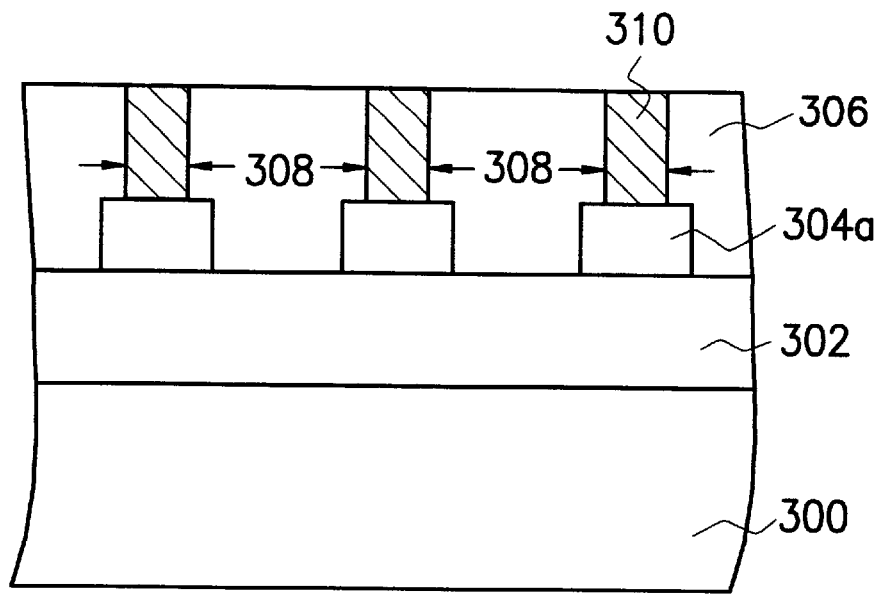
Figure 3E:
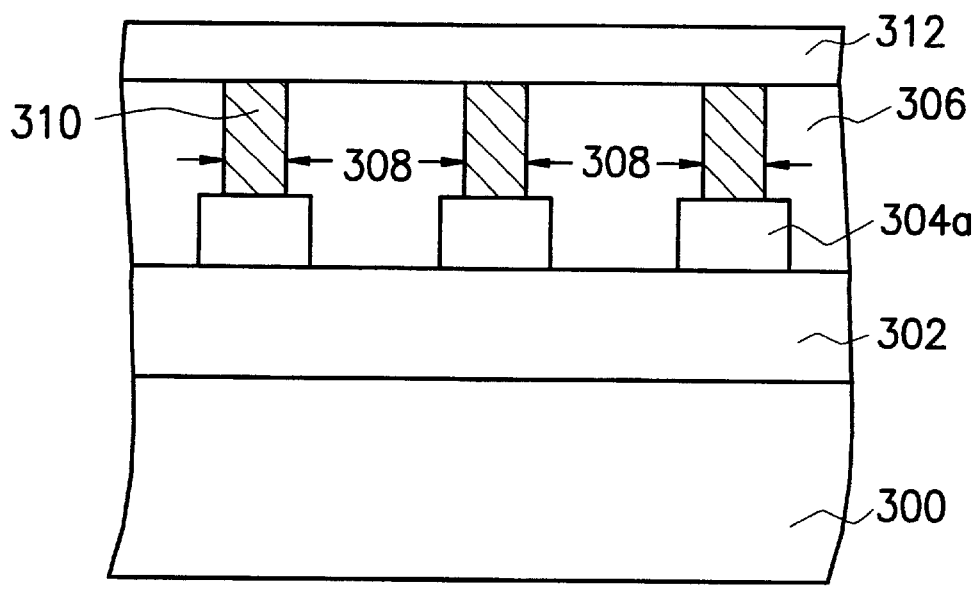
Figure 3F:
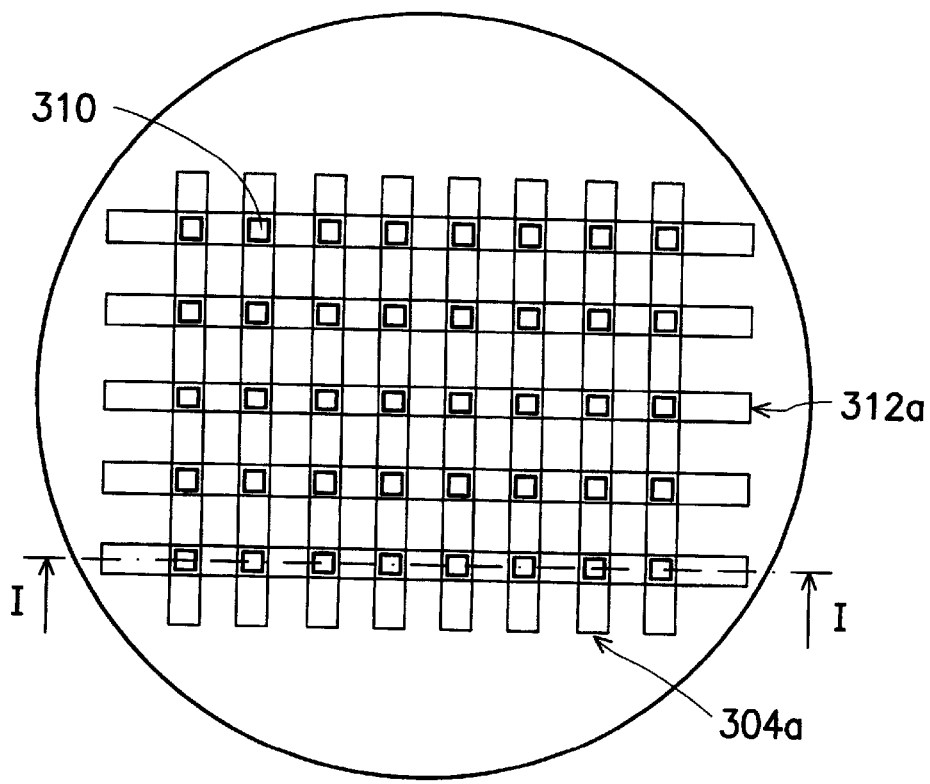
Figure 3G:
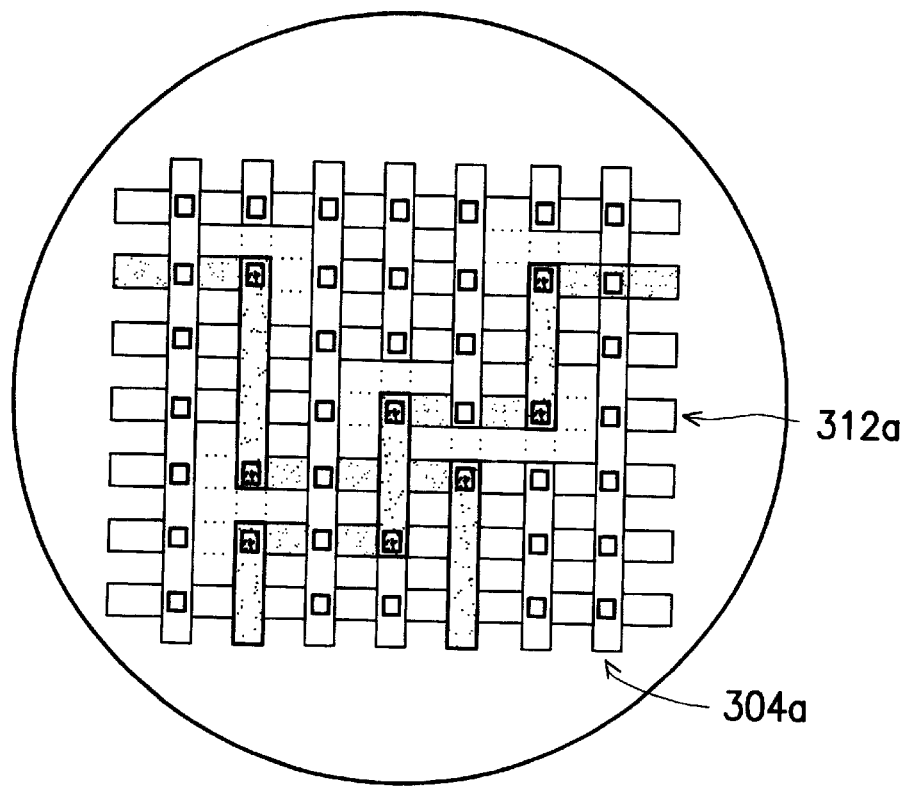

Referring to FIG. 3D, the dielectric layer 306 is defined to form a plurality of via holes 308 until a portion of the metal lines 304a are exposed. A plurality of metal plugs 310 in the via holes 308 wherein the plugs 310 and the dielectric layer 306 have the same surface level. The method of forming the metal plugs 310 includes forming a metal layer (not shown) over the substrate 300 to fill the via holes 308, then performing a planarization step to remove the unwanted portion of the metal layer to form the plugs 310 in the via holes 308.

Referring to FIG. 3E, another metal layer 312 is formed on the dielectric layer 306 and the metal plugs 310.

Referring to FIG. 3F, the metal layer 312 is defined to form a plurality of metal lines 312a with a second direction. The metal lines 312a are uniform over the substrate 300. The metal lines 312a are electrically coupled to the metal lines 304a through the metal plugs 310.

The first direction and the second direction are different. Preferably, the first direction is perpendicular to the second direction.

Referring to FIG. 3G, according to the required interconnect pattern, unnecessary connection between the metal lines 312a is broken, and the broken metal lines 312a remain to form a connected metal pattern and a dummy metal pattern so that the substrate 300 has a uniform pattern density. In FIG. 3G, dash lines between the metal lines 312a are the broken portions of the metal lines 312a; that is, the unnecessary connection portion of the metal lines 304a. Herein the breaking method includes dry etching, for example.

Similarly, the dummy metal pattern can be floating, or connected to a ground or a power source.

In this embodiment, metal layers with a fixed layout and uniform pattern density is formed on a wafer. Then, unnecessary connection between the metal layers is broken by etching. The broken metal layers are still remained to serve as a dummy metal pattern so that the metal layers are uniform on the wafer. Thus, a loading effect can be avoided while fabricating an interconnect. Device reliability is enhanced and yield is increased.

Third Embodiment

The method of forming a dummy metal pattern of the invention is applied to fabricate a photoremask pattern of an interconnect. Accordingly, the invention is to provide a method of forming a dummy metal pattern. The designing method of the invention is described as followed and together with flow chart in FIG. 4.

Figure 4:
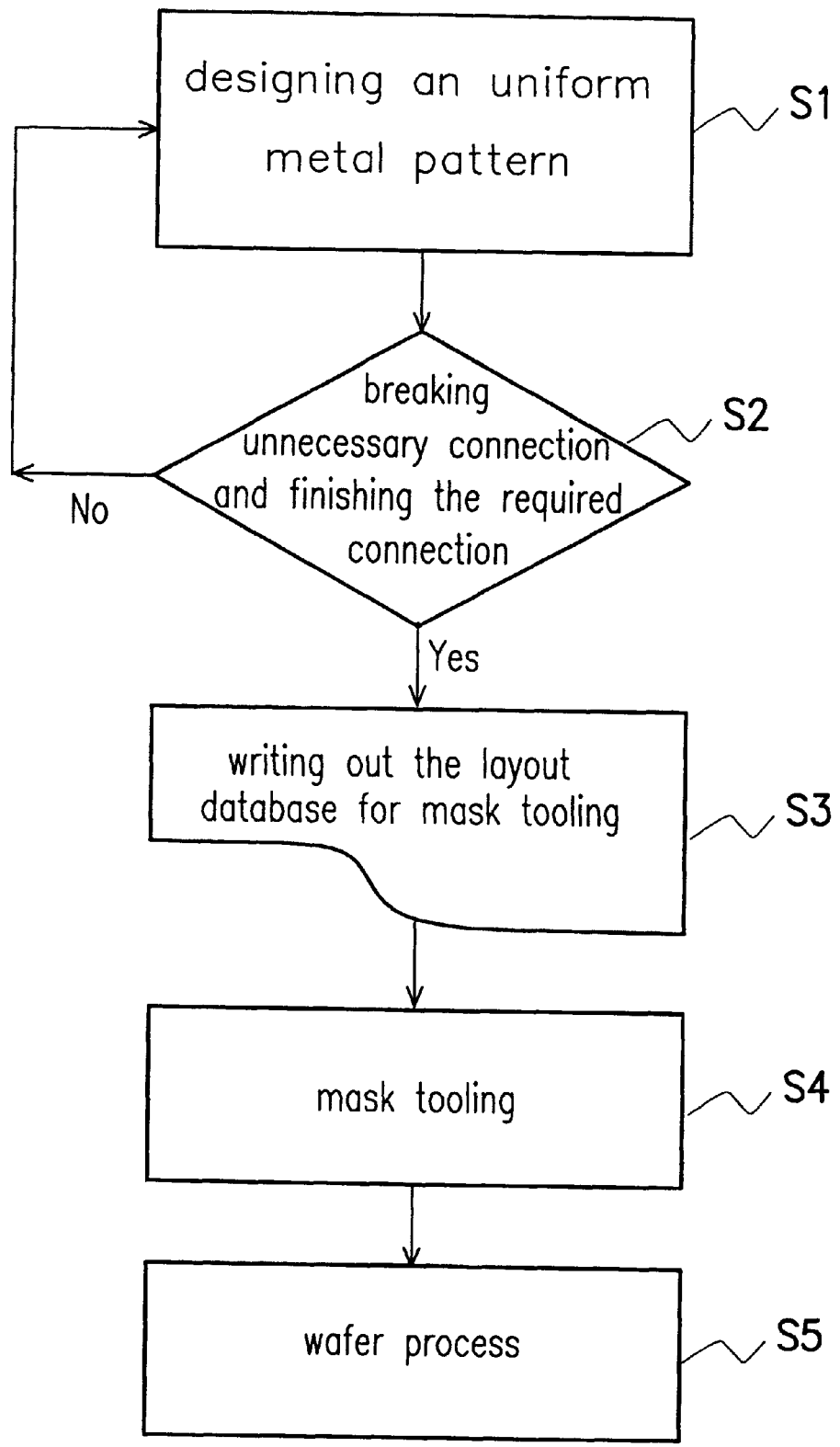
FIG. 4 is a flow chart describing a method for designing a photomask for patterning an interconnect pattern according to a third preferred embodiment of this invention.

FIG. 4 is a flow chart describing a method for designing a photomask for patterning an interconnect pattern according to a third preferred embodiment of this invention.

Referring to FIG. 4, in step S1, a metal pattern with uniform pattern density is designed. The metal pattern comprises a first metal pattern with a first direction and uniform pattern density, and a second metal pattern with a second direction and uniform pattern density. The first direction is perpendicular to the second direction Step S2 is performed. According to the required interconnect pattern, unnecessary connections between the first metal lines and between the second metal lines are broken. The broken first metal lines and the broken second metal lines remain to form a connected metal pattern and a dummy metal pattern.

After unnecessary connection is broken and the required connection is complete, step S3 is performed. The layout database is written out for an interconnect photomask tooling.

In step S4, an interconnect photomask is fabricated according to the layout database.

Step S5 is performed. Using the photomask fabricated by the invention, a required interconnect is formed on a wafer.

Steps S1 to S4 are performed by a computer.

Accordingly, one advantage of the invention is to provide a dummy metal pattern on a wafer having a fixed layout while forming an interconnect so as to make uniform the metal pattern on the wafer. Thus, the loading effect can be avoided to enhance device reliability and increase device yield.

Another advantage of the invention is to retain unnecessary connection of metal lines to serve as a dummy metal so as to make uniform the metal line pattern for the benefit of subsequent processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dummy metal pattern, used for manufacturing an interconnect pattern, the method comprising the steps of:

providing a substrate;

forming a first dielectric layer on the substrate;

forming a first metal layer on the first dielectric layer;

defining the first metal layer to form a plurality of first metal lines along a first direction, wherein the first metal lines are uniformly distributed on the substrate;

breaking the first metal lines according to the interconnect pattern into a first metal pattern and a first dummy metal pattern that achieve a uniform pattern density on the substrate;

forming a second dielectric layer on the metal lines and the first dielectric layer;

defining the second dielectric layer in a manner to partially expose the first metal lines to form a plurality of via holes;

forming a plurality of plugs in the via holes wherein the plugs and the second dielectric layer have a same surface level;

forming a second metal layer on the second dielectric layer and the plugs;

defining the second metal layer to form a plurality of second metal lines along a second direction, wherein the second metal lines are uniformly distributed; and breaking the second metal lines according to the interconnect pattern into a second metal pattern and a second dummy metal pattern that achieve a uniform pattern density on the substrate, the second metal pattern being electrically connected to the first metal pattern.

2. The method according to claim 1, wherein the first dummy metal pattern is connected to a ground.

3. The method according to claim 1, wherein the second dummy metal pattern is connected to a ground.

4. The method according to claim 1, wherein the first dummy metal pattern is floating.

5. The method according to claim 1, wherein the second dummy metal pattern is floating.

6. The method according to claim 1, wherein the first dummy metal pattern is connected to a power source.

7. The method according to claim 1, wherein the second dummy metal pattern is connected to a power source.

8. The method according to claim 1, wherein the first direction and the second direction are different.

9. The method according to claim 1, wherein the first direction is perpendicular to the second direction.

10. The method according to claim 1, wherein the unnecessary connection is broken by dry etching.

11. A method for designing a photomask for patterning an interconnect pattern, the method comprising the steps of:

forming a metal pattern having a uniform pattern density, the metal pattern comprising a first metal pattern uniformly distributed along a first direction, and a second metal pattern uniformly distributed along a second direction, wherein the first direction is perpendicular to the second direction; and breaking the first metal pattern into a first metal interconnect pattern and a first dummy metal pattern, and breaking the second metal pattern into a second metal interconnect pattern and a second dummy metal pattern, the first metal pattern and the second metal pattern being broken in a manner to achieve a uniform pattern density on the substrate.

12. The method according to claim 11, wherein the steps are performed by a computer.

* * * * *